United States Patent [19]

Kanagawa

[11] Patent Number: 4,845,775
[45] Date of Patent: Jul. 4, 1989

[54] LOUDSPEAKER REPRODUCTION APPARATUS IN VEHICLE

[75] Inventor: Akira Kanagawa, Saitama, Japan

[73] Assignee: Pioneer Electronic Corporation, Tokyo, Japan

[21] Appl. No.: 125,279

[22] Filed: Nov. 25, 1987

[30] Foreign Application Priority Data

Nov. 28, 1986 [JP] Japan ................................. 61-182064

[51] Int. Cl.$^4$ ............................................. H03G 5/00
[52] U.S. Cl. ...................................... 381/102; 381/24; 381/105; 381/109
[58] Field of Search ................... 381/102, 24, 105, 86, 381/107, 109, 98

[56] References Cited

U.S. PATENT DOCUMENTS 3,073,901  1/1963  Hafler ................................. 381/109
3,487,341 12/1969  Grout ................................. 381/102

Primary Examiner—Forester W. Isen
Attorney, Agent, or Firm—Sughrue, Mion, Zinn, Macpeak & Seas

[57] ABSTRACT

In a loudspeaker system having an adjustable balance between two speakers having different low frequency reproduction characteristics, the attenuation of low frequency signals applied to the loudspeaker with the better low frequency reproduction characteristics is selectively inhibited even when the balance is adjusted toward the other loudspeaker, so that an adequate low frequency sound will be produced at all times.

8 Claims, 2 Drawing Sheets

LOUDSPEAKER REPRODUCTION APPARATUS IN VEHICLE

BACKGROUND OF THE INVENTION

The present invention relates to the improvement of a loudspeaker reproduction apparatus which is installed in a vehicle and has a sound volume balance control circuit which regulates the levels of audio signals to be applied to a plurality of loudspeakers disposed in front and rear positions in the vehicle.

A typical conventional loudspeaker reproduction apparatus installed in a vehicle includes a total of four loudspeakers, two loudspeakers disposed either at the sides of the instrument panel of the vehicle or in the right and left front doors thereof, and other two loudspeakers disposed at both sides of the pit of the vehicle, i.e., the deck behind the rear seat and beneath the rear window. The four-loudspeaker system is provided with a fader control circuit which regulates the balance of sound volumes of the front and the rear loudspeakers.

FIG. 4 shows a wiring diagram of an example of such a conventional loudspeaker reproduction apparatus which comprises input terminals 1R and 1L for right-channel and left-channel audio signals, respectively, variable resistors 2 and 3, having sliding terminals 2' and 3' which are ganged for operation in conjunction with each other, power amplifiers 4, 5, 6 and 7, a left front loudspeaker 8L, a right front loudspeaker 8R, a left rear loudspeaker 9L, a right rear loudspeaker 9R, and resistors $R_1$, $R_2$, $R_3$ and $R_4$. The left-channel audio signal sent to the input terminal 1L is applied to the loudspeakers 8L and 9L through the resistors $R_1$ and $R_2$ and the power amplifiers 4 and 6 and is grounded through the variable resistor 2. The right-channel audio signal sent to the input terminal 1R is applied to the loudspeaker 8R and 9R through the resistors $R_3$ and $R_4$ and the power amplifiers 5 and 7 and is grounded through the variable resistor 3.

The variable resistors 2 and 3, which operate in conjunction with each other, constitute a front and rear sound volume balance control circuit. The sliding terminals 2' and 3' of the variable resistors 2 and 3 are moved to regulate the balance of sound volumes of the front loudspeakers 8L and 8R and the rear loudspeakers 9L and 9R. When the sliding terminals 2' and 3' are moved in a direction shown by an arrow R in FIG. 4, the outputs from the rear loudspeakers 9L and 9R are increased and those from the front loudspeakers 8L and 8R are decreased. When the sliding terminals 2' and 3' are moved in another direction shown by an arrow F in FIG. 4, the outputs from the front loudspeakers 8L and 8R are increased and those from the rear loudspeakers 9L and 9R are decreased.

Since the rear loudspeakers 9L and 9R are disposed in a rear pit or the like which has a relatively large installation space for them, the diameter of each of the rear loudspeakers to be installed in the space can be made relatively large, e.g., 16 cm to 20 cm. The trunk space of the vehicle can be utilized as an acoustic cavity behind the rear loudspeakers to reproduce a sound of low pitch.

On the other hand, the diameter of each of the front loudspeakers 8L and 8R cannot be made larger than about 10 cm, because the installation space for each of them is limited. Further, the battle effect for the front loudspeakers 8L and 8R is often insufficient. For these reasons, it is difficult to reproduce a sufficient low pitch sound from the front loudspeakers 8L and 8R.

Since the levels of the audio signals to be applied to the loudspeakers 8L, 8R, 9L and 9R are regulated by the sound volume balance control circuit without considering the difference between the low-pitch sound reproduction characteristic of the front loudspeaker 8L and 8R and that of the rear loudspeakers 9R and 9L, there is a problem that the frequency balance of reproduced sound is likely to change when the volume balance is adjusted. Particularly when the sliding terminals 2' and 3' of the variable resistors 2 and 3 are moved in the direction shown by the arrow F in FIG. 4, the audio signals are only slightly applied to the rear loudspeakers 9L and 9R capable of reproducing relatively sufficient low-pitch sounds, so that the low-frequency portion of the entire sound reproduced by all the loudspeakers become quite insufficient.

In order to solve the above-mentioned problem, another conventional loudspeaker reproduction apparatus shown in FIG. 5 has been proposed. The difference of the conventional loudspeaker reproduction apparatus shown in FIG. 5 from that shown in FIG. 4 is that capacitors $C_1$ and $C_2$ are connected between ground and the sliding terminals 2' and 3' of variable resistors 2 and 3. The same reference symbols in FIGS. 4 and 5 otherwise designate the same components. In the loudspeaker reproduction apparatus shown in FIG. 5, the capacitors $C_1$ and $C_2$ are connected between ground and the sliding terminals 2' and 3' of the variable resistors 2 and 3 so that the low-frequency components of audio signals sent to input terminals 1L and 1R are always applied both to front loudspeakers 8L and 8R and to rear loudspeakers 9L and 9R to solve the above-mentioned problem of the loudspeaker reproduction apparatus shown in FIG. 4. In other words, low-pitch sounds which give less of a feeling of direction are always reproduced by both the front loudspeakers 8L and 8R and the rear loudspeakers 9L and 9R to prevent the low-pitch portion of the entire reproduced sound from becoming insufficient.

However, the loudspeaker reproduction apparatus shown in FIG. 5 also has a problem that, when the sliding terminals 2' and 3' of the variable resistors 2 and 3 are moved in a direction shown by an arrow R in FIG. 5, only the low-frequency components of the audio signals are applied to the front loudspeakers 8L and 8R of poorer low-pitch sound reproduction characteristic, so that the distortions of the sounds reproduced by the front loudspeakers are more audible. Since the front loudspeakers 8L and 8R are generally located near the listener, the frequency cut off by the capacitors $C_1$ and $C_2$ needs to be made considerably low in order to prevent the distortions of the sound from becoming more audible when the sliding terminals 2' and 3' are moved in the direction shown by the arrow R. However, if the cut-off frequency is made considerably low, it is difficult to cause the rear loudspeakers 9L and 9R to compensate for the insufficiency of the low-pitch sounds reproduced by the front loudspeakers 8L and 8R when the sliding terminals 2' and 3' are moved in the reverse direction shown by an arrow F.

The present invention has been made in order to solve the above-mentioned problems.

SUMMARY OF THE INVENTION

Accordingly, it is an object of the present invention to provide a loudspeaker reproduction apparatus in which, when fader resistors (which are variable resistors) are controlled to apply signals to loudspeakers of poorer low-pitch sound reproduction characteristic, low-pitch sounds are reproduced by loudspeakers of better low-pitch sound reproduction characteristic regardless of the positions of the fader resistors, so that the low-pitch portion of the entire sound reproduced by all the loudspeakers is made sufficient. Further, when the fader resistors are controlled to apply signals to the loudspeakers of better low-pitch sound reproduction characteristic, signals having a nearly flat frequency characteristic from the low-frequency band through the high-frequency band are applied to the loudspeakers of better low-pitch sound reproduction characteristic so that the low-pitch portion of the entire sound reproduced by all the loudspeakers is made quite sufficient.

In the device of this invention, series circuits consisting of variable resistors and capacitors are connected between signal lines which serve to apply audio signals to first and second loudspeakers, and the sliding terminals of the variable resistors are moved to control the levels of the audio signals to be applied to the first and second loudspeakers. One terminal of each capacitor is connected to the signal line which applies the audio signals to the loudspeaker of better low-pitch sound reproduction characteristic. One terminal of each variable resistor is connected to the signal lines which applies the audio signal to the loudspeakers of poorer low-pitch sound reproduction characteristic.

BRIEF DESCRIPTION OF THE DRAWINGS

The invention will be more clearly understood from the following description in conjunction with the accompanying drawings, in which.

DETAILED DESCRIPTION OF THE PREFERRED EMBODIMENTS

Figure 1:
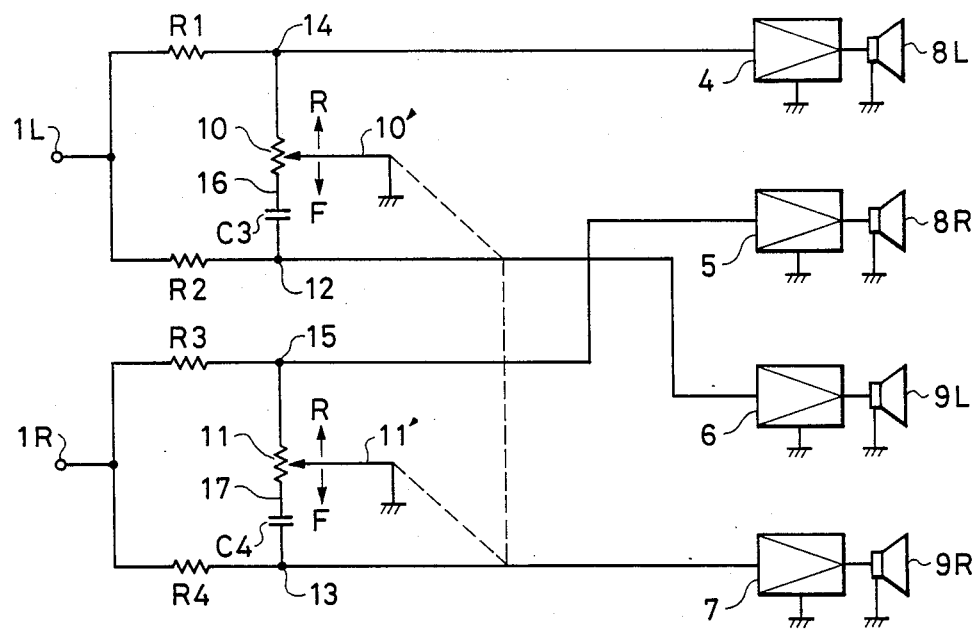
FIG. 1 shows a wiring diagram of a loudspeaker reproduction apparatus according to a first embodiment of the present invention.
Figure 4:
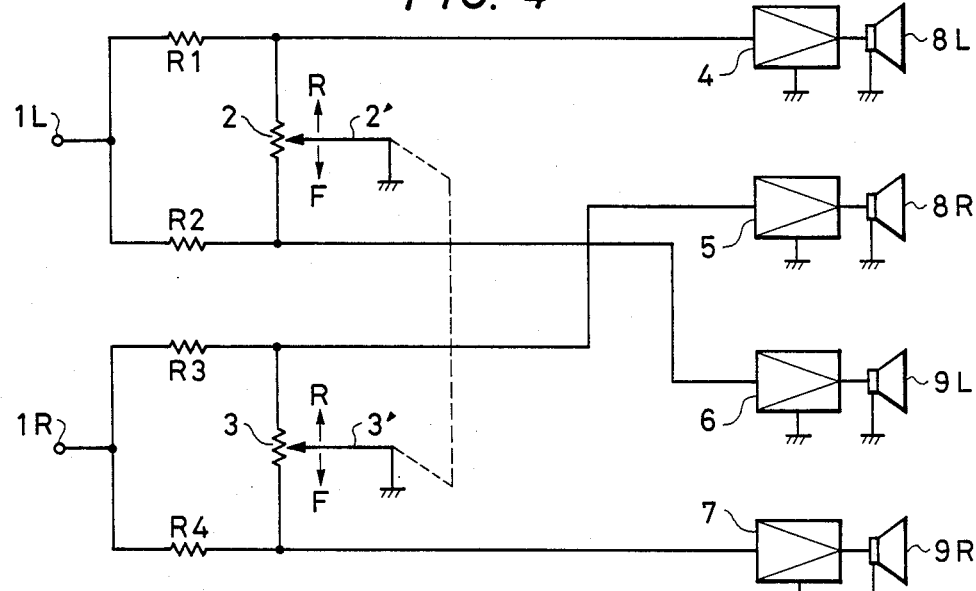
FIGS. 4 and 5 show wiring diagrams of conventional loudspeaker reproduction apparatuses.
Figure 5:
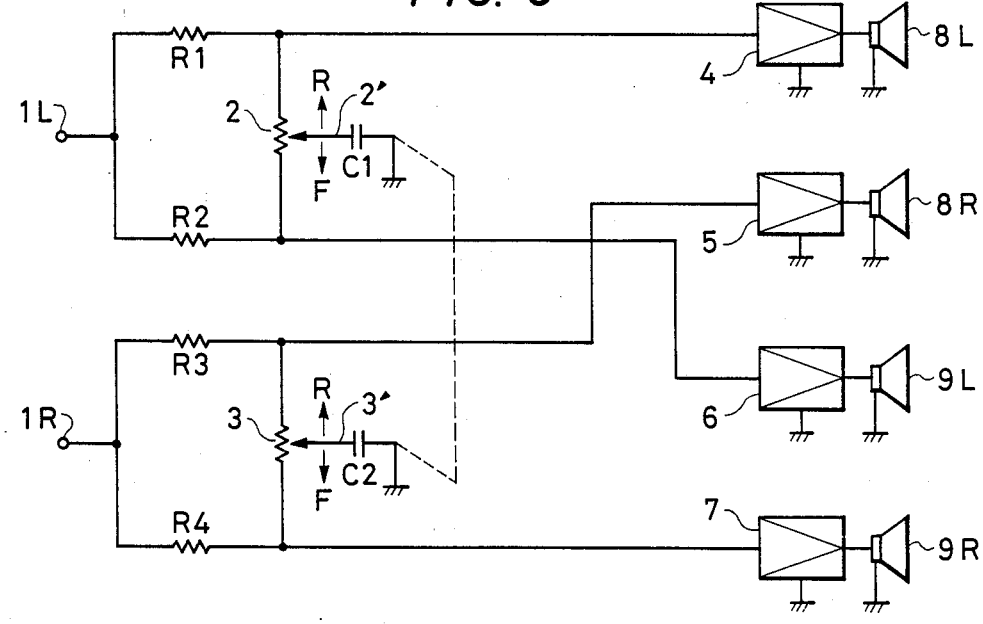

An embodiment of the present invention will now be described with reference to FIG. 1. The difference between the loudspeaker reproduction apparatus of the present invention and the conventional loudspeaker reproduction apparatuses shown in FIGS. 4 and 5 is that series circuits consisting of capacitors $C_3$ and $C_4$ and variable resistors 10 and 11 are provided between signal lines 12 and 13 for applying audio signals to rear loudspeakers 9L and 9R of better low-pitch sound reproduction characteristics and other signal lines 14 and 15 for applying audio signals to front loudspeakers 8L and 8R of poorer low-pitch sound reproduction characteristic, respectively. One terminal of each of capacitors $C_3$ and $C_4$ is connected to the signal lines 12 or 13 for applying the audio signals to the rear loudspeakers 9L or 9R of better low-pitch sound reproduction characteristic. One terminal of each of variable resistors 10 and 11 is connected to the signal lines 14 or 15 for applying the audio signals to the front loudspeakers 8L and 8R of poorer low-pitch sound reproduction characteristic. Except in these respects, the arrangement of the loudspeaker reproduction apparatus of FIG. 1 is the same as is shown in FIGS. 4 and 5. The same reference symbols in FIGS. 1, 4 and 5 denote the same components.

The capacitance C of each of the capacitors $C_3$ and $C_4$ of the apparatus shown in FIG. 1 is set as follows:

$$f_c = \frac{1}{2\pi CR} \quad (1)$$

In the formula (1), R denotes the resistance of each of resistors $R_2$ and $R_4$ and $f_c$ denotes a frequency of about 100 to 300 Hz.

The resistance of each of the variable resistors 10 and 11 is set to be much higher than the impedance of resistors $R_1$, $R_2$, $R_3$ and $R_4$ and also higher than the impedance of the capacitors $C_3$ and $C_4$ for the audio frequency band.

As a result, when the sliding terminals 10' and 11' of the variable resistors 10 and 11 are moved in a direction F, the capacitors $C_3$ and $C_4$ act so that the low-frequency components which belong to the audio signals and whose frequency is not higher than the frequency $f_c$ expressed by the formula (1) are applied to the rear loudspeakers 9L and 9R to compensate for the insufficiency of low-pitch sounds, and signals having a nearly flat frequency characteristic from the low frequency band through the high frequency band are applied to the front loudspeakers 8L and 8R of poorer low-pitch sound reproduction characteristic. Consequently, the low-pitch portion of the entire sound reproduced by the loudspeaker reproduction apparatus is made sufficient.

When the sliding terminals 10' and 11' of the variable resistors 10 and 11 are moved in the reverse direction R, the resistances between the sliding terminals and the junctions 16 and 17 of the variable resistors and the capacitors $C_3$ and $C_4$ are made much higher than the impedances of the capacitors, so that the quantities of the audio signals applied to the front loudspeakers 8L and 8R are decreased and signals having a high level and a nearly flat frequency characteristic from the low frequency band through the high frequency band are applied to the rear loudspeakers 9L and 9R to perform reproduction by the rear loudspeakers of better low-pitch sound reproduction characteristic, similarly to the conventional loudspeaker reproduction apparatus shown in FIG. 5. Consequently, the low-pitch portion of the entire sound reproduced by the loudspeaker reproduction apparatus shown in FIG. 1 is made sufficient.

Figure 3:
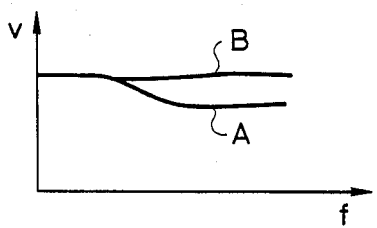
FIG. 3 shows graphs of reproduction frequency characteristics of signals applied to front and rear speakers.

Although the resistance of each of the variable resistors 10 and 11 is set to be much higher than that of the resistors $R_1$, $R_2$, $R_3$ and $R_4$ in the above-described embodiment, the present invention is not confined thereto but may be otherwise embodied so that the resistance of each of variable resistors 10 and 11 is set to be relatively near that of resistors $R_1$, $R_2$, $R_3$ and $R_4$. With such an arrangement, signals which are applied to rear loudspeakers 9L and 9R will have a frequency characteristic shown by a curve A in FIG. 3 and will be different in level from the frequency characteristic B of signals for front loudspeakers 8L and 8R with respect to the high frequency band. For that reason, the apparent source of the entire sound reproduced will be fixedly located at or near the front loudspeakers. However, since low-pitch sounds which do not give a feeling of direction are reproduced by both the front loudspeakers and the rear loudspeakers, a sufficient low-pitch sound reproduction characteristic is provided.

Figure 2:
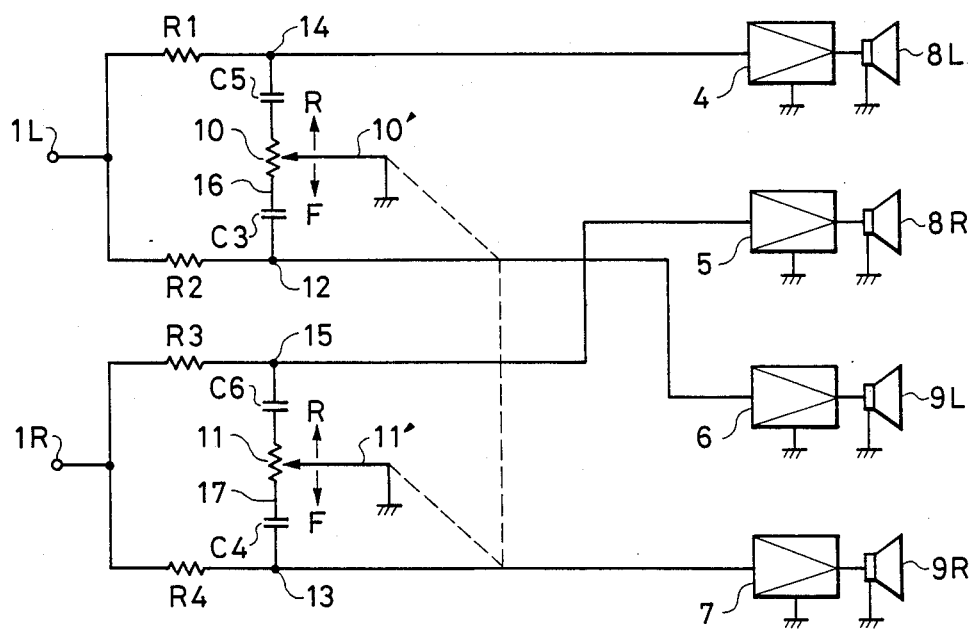
FIG. 2 shows a wiring diagram of a loudspeaker reproduction apparatus according to a second embodiment of the present invention.

In the embodiment shown in FIG. 1, the variable resistors 10 and 11 are directly connected to the signal lines for signal application to the front loudspeakers. However, if the difference in low-pitch sound reproduction capacity between the front and the rear loudspeakers is slight, there will still be an extreme change in sound likely to be felt due to the adjustment of the sound volume balance between the front and the rear loudspeakers in the case of signals having insufficient low frequency content. To overcome this problem, as shown in FIG. 2, capacitors $C_5$ and $C_6$ may be connected between the variable resistors and the front speaker signal lines, and may be designed to have time constants smaller than those determined by a resistor $R_2$ and a capacitor $C_3$ and a resistor $R_4$ and a capacitor $C_4$, respectively, for the rear loudspeakers. As a result, it is possible to compensate for the insufficiency of low-pitch sounds, depending on the slight difference in low-pitch sound reproduction capacity between the front and the rear loudspeakers.

According to the present device, when the levels of audio signals to be applied to first loudspeakers of poorer low-pitch sound reproduction characteristic are heightened by manipulating variable resistors, the capacitors cause the low-frequency components of the audio signals to be applied to second loudspeakers of between low-pitch sound reproduction characteristic so that the second loudspeakers will reproduce sufficient low-pitch sounds which the first loudspeakers cannot reproduce. When the levels of audio signals to be applied to the second loudspeakers of better low-pitch sound reproduction characteristic are heightened by manipulating the variable resistors, the resistances of the variable resistors become much higher than the impedances of the capacitors so that signals having a high level and a nearly flat frequency characteristic from the low frequency band through the high frequency band are applied to the second loudspeakers to reproduce sufficient low-pitch sounds. Sufficient low-pitch sounds are thus reproduced in either case, i.e., whether the fader control is adjusted to the first or second loudspeakers.

What is claimed is:

1. A loudspeaker reproduction system for reproducing a sound having a low frequency component, said system comprising:
   at least one first loudspeaker;
   at least one second loudspeaker having a better low frequency sound reproduction characteristic than said first loudspeaker;
   first and second signal lines for providing sound signals to respective ones of said first and second loudspeakers;
   balance means for adjusting the magnitudes of the sound signals applied to each of said first and second loudspeakers over said signal lines; and
   first low frequency enhancement means coupled to said second signal line for supplying the low frequency component of said sound signals to said second loudspeaker when said balance means is adjusted to provide a higher magnitude of said sound signals to said first loudspeaker without substantially affecting the frequency distribution of the signal on said first signal line.

2. A loudspeaker reproduction system as claimed in claim 1, wherein said balance means is adjustable between a first position in which the sound signals on said first signal line are subjected to a higher degree of attenuation than the sound signals on said second signal line, and a second position in which the sound signals on said second signal line are subjected to a higher degree of attenuation than the sound signals on said first signal line, said first low frequency enhancement means comprising means for selectively preventing attenuation of said low frequency component on said second signal line when said balance means is in said second position without substantially affecting the relative attenuation of the low frequency component of the signal on said first signal line when said balance means is in said first position.

3. A loudspeaker reproduction system as claimed in claim 1, further comprising an input terminal for receiving an input sound signal and first and second resistors for coupling said input sound signal to said first and second signal lines, respectively, and wherein said balance means comprises a variable resistor connected between said first and second signal lines, said variable resistor having a resistance value not substantially greater than the resistance values of said first and second resistors.

4. A loudspeaker reproduction system as claimed in claim 1, further comprising an input terminal for receiving an input sound signal and first and second resistors for coupling said input sound signal to said first and second signal lines, respectively, and wherein said balance means comprises a variable resistor connected between said first and second signal lines, said variable resistor having a resistance value substantially greater than the resistance values of said first and second resistors.

5. A loudspeaker reproduction system for reproducing a sound having a low frequency component, said system comprising:
   at least one first loudspeaker;
   at least one second loudspeaker having a better low frequency sound reproduction characteristic than said first loudspeaker;
   first and second signal lines for providing sound signals to respective ones of said first and second loudspeakers;
   balance means for adjusting the magnitudes of the sound signals applied to each of said first and second loudspeakers over said signal lines; and
   first low frequency enhancement means coupled to said second signal line for supplying the low frequency component of said sound signals to said second loudspeaker when said balance means is adjusted to provide a higher magnitude of said sound signals to said first loudspeaker without substantially affecting the frequency distribution of the signal on said first signal line;
   wherein said balance means is adjustable between a first position in which the sound signals on said first signal line are subjected to a higher degree of attenuation than the sound signals on said second signal line, and a second position in which the sound signals on said second signal line are subjected to a higher degree of attenuation than the sound signals on said first signal line, said first low frequency enhancement means comprising means for selectively preventing attenuation of said low frequency component on said second signal line when said balance means is in said second position without substantially affecting the relative attenuation of the low frequency component of the signal on said first signal line when said balance means is in said first position.

wherein said balance means comprises a variable resistor connected between said first and second signal lines, and said first low frequency enhancement means comprises a first capacitor coupled in series with said variable resistor and connected between said variable resistor and said second signal line.

6. A loudspeaker reproduction system as claimed in claim 3, wherein said variable resistor is d.c. coupled to said first signal line.

7. A loudspeaker reproduction system as claimed in claim 5, further comprising second low frequency enhancement means comprising a second capacitor connected in series with said variable resistor between said variable resistor and said first signal line.

8. A loudspeaker reproduction system as claimed in claim 7, wherein said second capacitor has a capacity smaller than that of said first capacitor.

* * * * *